United States Patent
Beyer et al.

(10) Patent No.: US 8,441,803 B2
(45) Date of Patent: May 14, 2013

(54) RETAINING FACILITY FOR PRINTED CIRCUIT BOARDS ON CURVED SURFACES

(75) Inventors: Bernd Beyer, Langensendelbach (DE); Horst Friesner, Altendorf (DE); Markus Hemmerlein, Neunkirchen/Br (DE); Florian Hofmann, Erlangen (DE); Helmut Repp, Erlangen (DE); Wolfgang Schnitzerlein, Kirchehrenbach (DE); Markus Stark, Waizendorf (DE); Peter Tichy, Uttenreuth (DE)

(73) Assignee: Siemens Aktiengesellschaft, München (DE)

( * ) Notice: Subject to any disclaimer, the term of this patent is extended or adjusted under 35 U.S.C. 154(b) by 377 days.

(21) Appl. No.: 12/415,358

(22) Filed: Mar. 31, 2009

(65) Prior Publication Data

US 2009/0251871 A1 Oct. 8, 2009

(30) Foreign Application Priority Data

Apr. 3, 2008 (DE) .......................... 10 2008 017 155

(51) Int. Cl.
*H05K 5/00* (2006.01)
*H05K 1/00* (2006.01)
*H05K 7/14* (2006.01)
*H05K 7/18* (2006.01)

(52) U.S. Cl.
USPC ............ 361/759; 361/749; 361/801; 174/254

(58) Field of Classification Search .................. 174/254, 174/250, 255; 361/749, 759, 801, 755, 727; 216/9; 257/E23.177; 367/183; 439/940
See application file for complete search history.

(56) References Cited

U.S. PATENT DOCUMENTS

| | | | | |
|---|---|---|---|---|
| 2,703,853 A | * | 3/1955 | Chryatie | 361/750 |
| 5,204,806 A | * | 4/1993 | Sasaki et al. | 361/749 |
| 6,778,389 B1 | * | 8/2004 | Glovatsky et al. | 361/690 |
| 2006/0071173 A1 | * | 4/2006 | Zeman et al. | 250/370.11 |
| 2011/0310605 A1 | * | 12/2011 | Renn et al. | 29/829 |

FOREIGN PATENT DOCUMENTS

| | | |
|---|---|---|
| DE | 43 43 127 A1 | 6/1994 |
| DE | 44 29 983 C1 | 11/1995 |
| DE | 101 61 173 C1 | 7/2003 |
| DE | 103 12 158 A1 | 10/2004 |
| DE | 103 41 215 B4 | 10/2007 |
| DE | 10341884 B4 * | 10/2007 |
| WO | WO 9015478 A2 * | 12/1990 |

OTHER PUBLICATIONS

Berhold WO 90/15478.*
Original foreign copy of DE10341884B4 attached.*
German Office Action dated Mar. 7, 2011 for corresponding German Patent Application No. DE 10 2008 017 155.7-34 with English translation.

* cited by examiner

*Primary Examiner* — Timothy Thompson
*Assistant Examiner* — Roshn Varghese
(74) *Attorney, Agent, or Firm* — Lempia Summerfield Katz LLC

(57) ABSTRACT

A retaining facility for clearance-free fixing of a printed circuit board onto a one-dimensional curved surface is provided. In the direction of curvature of the one-dimensional curved surface, a tensile or compressive force acts on the printed circuit board or on at least one first connection device connected to the latter, with the printed circuit board being bent and pressed onto the curved surface. In this way the printed circuit board is held solidly and with little vibration on the surface even when acted on by centrifugal forces.

18 Claims, 4 Drawing Sheets

RETAINING FACILITY FOR PRINTED CIRCUIT BOARDS ON CURVED SURFACES

The present patent document claims the benefit of the filing date of DE 10 2008 017 155.7 filed Apr. 3, 2008, which is hereby incorporated by reference.

BACKGROUND

The present embodiments relate to fixing printed circuit boards onto a one-dimensional curved surface without any clearance.

When electrical and electronic devices are constructed, printed circuit boards equipped with components are usually arranged and fixed in or on the housing of the devices. Long, extended printed circuit boards are fixed to the outer surface of a cylinder or the inner surface of a hollow cylinder. For non-contact signal transmission in computer tomography, printed circuit boards with lengths of over two meters are fixed to the inner or outer side of rings with a diameter of more than 1.6 m. The printed circuit boards are glued and/or screwed to the rings.

SUMMARY AND DESCRIPTION

The present embodiments may obviate one or more of the drawbacks or limitations of the related art. For example, in one embodiment, a retaining facility for printed circuit boards with which long printed circuit boards are able to be installed easily and quickly with no clearance is provided. The centrifugal forces can be accommodated. The printed circuit boards are easy to exchange. Compensation is able to be provided for different coefficients of thermal expansion and the signal transmission characteristics are not adversely affected. For example, tensile or compressive forces are applied in the direction of curvature of a one-dimensional curved surface, so that a printed circuit board will be adapted to the concave or convex surface.

In one embodiment, a retaining facility for clearance-free fixing of printed circuit boards onto a one-dimensional curved surface is provided. In the direction of curvature of the one-dimensional curved surface, a tensile or compressive force acts on the printed circuit board or on at least a first connection device connected to the printed circuit board. As a result, the printed circuit board is bent and is pressed onto the curved surface.

As used herein, a force in the direction of curvature connection device includes a force component that acts tangentially in the direction of curvature of the surface.

In another embodiment, a retaining facility for clearance-free fixing printed circuit boards onto a one-dimensional curved surface includes a tensile or compressive force acting in the direction of curvature of the one-dimensional curved surface on at least one first connection device solidly connected detachably to the printed circuit board. As a result, the first connection device and the printed circuit board are bent and the first connection device is pressed onto the curved surface.

Printed circuit boards can be installed and removed quickly and easily. An appropriate arrangement of the forces is able to cater for centrifugal forces occurring in the system without the forces having an influence on the position of the printed circuit board. Tensioned printed circuit boards may lie over a wide surface close to the curved body with a force that can be adjusted by the tension, which prevents a movement/vibration of the printed circuit boards in rotating systems. The retaining facility may compensate for thermal expansion. A change of the ambient temperature may cause different coefficients of thermal expansion. Accordingly, tolerances, for example, the printed circuit board length and the diameter of a curved support, may be compensated for using the retaining facility. There may be no resulting negative effect on the transmission characteristics in data transmission systems, since no disruptive metallic elements are required in the area of the conductor tracks for fixing the conductor tracks.

The retaining facility may include at least one second connection device, such as a tension or compression spring. The second connection device may be arranged and embodied such that it introduces the tensile or compressive force into the circuit board or into the first connection device. As a result, the printed circuit boards may be installed and removed in a simple manner.

In a further embodiment, the printed circuit board or the first connection device may be held in a direction of curvature at one end by a fixing element, which for example is connected to the surface. The other free end of the printed circuit board or of the first connection device may be connected to the second connection device. Accordingly, the printed circuit board or the first connection device may be pressed onto the curved surface without clearance.

The at least one second connection device may be connected via at least one coupling element to the printed circuit board or to the first connection device. Accordingly, a simple, detachable, and secure connection between the second connection device and the printed circuit board, especially for printed circuit boards made from soft or flexible material, may be provided.

In a further embodiment, the at least one first connection device may be embodied in the shape of a rod, a thread, or a wire and may be routed through the inside of the printed circuit board or in grooves of the printed circuit board. Stresses in the printed circuit board may be minimized, which reduces elastic and plastic deformations of the printed circuit board.

The printed circuit board or the first connection device may be guided in the direction of curvature so that lateral shaking is prevented. The guidance may be provided by a recess in the curved surface, by at least one lateral groove embodied in the surface or by lateral delimiting elements arranged on the surface. The lateral groove or lateral delimiting elements guide the printed circuit board at right angles to the direction of tension or compression and securely hold the printed circuit board in this direction.

A further embodiment comprises a computer tomography system with a retaining facility. A long printed circuit board may be able to be mounted on the rings of the computer tomography system safely and without clearance.

Further special features and advantages are evident from the subsequent illustrations of a number of exemplary embodiments based on schematic drawings.

DETAILED DESCRIPTION

Figure 1:
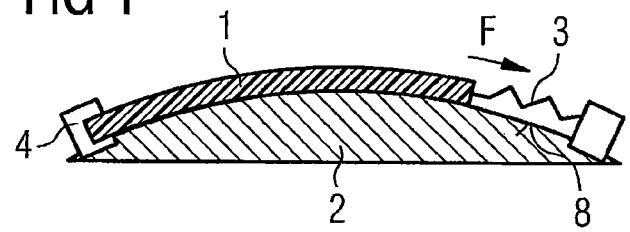
FIG. 1 illustrates a sectional view of a retaining facility with a tension spring.

FIG. 1 shows a section through a carrier 2 in the form of a circular cylinder segment, arranged on the concave curved surface 8 of which is a printed circuit board 1. The printed circuit board 1 is tensioned at one end in a fixing element 4. The fixing element 4 is structurally connected (fixed) to the surface 8 of the carrier 2. A tensile force F is applied to the free end of the printed circuit board 1 by a second connection device 3, shown as a tension spring. Accordingly a tensile stress is provided within the printed circuit board, through which the printed circuit board 1 is pressed onto the concave surface 8 of the carrier 2. Tensile forces may also be additionally applied at further points between the two ends of the printed circuit board 1.

Figure 2:
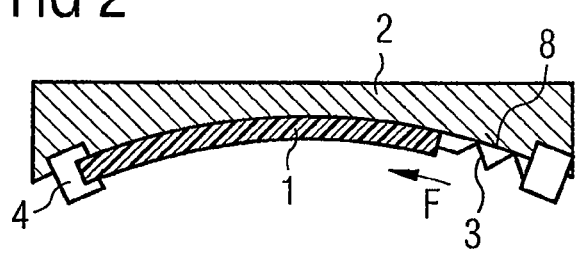
FIG. 2 illustrates a sectional view of a retaining facility with a compression spring.

FIG. 2 shows a section through a carrier 2 in the form of a circular cylinder segment, arranged on the convex curved surface 8 of which is a printed circuit board 1. The printed circuit board 1 is tensioned at one end in a fixing element 4. The fixing element 4 is structurally connected to the surface 8 of the carrier 2. A compressive force F is applied to the free end of the printed circuit board 1 by a second connection device 3, shown as a compression spring. Accordingly, a compressive stress is produces within the printed circuit board 1, through which the printed circuit board 1 is pressed onto the convex surface 8 of the carrier 2. Compressive forces may also be additionally applied at further points between the two ends of the printed circuit board 1.

Figure 3:
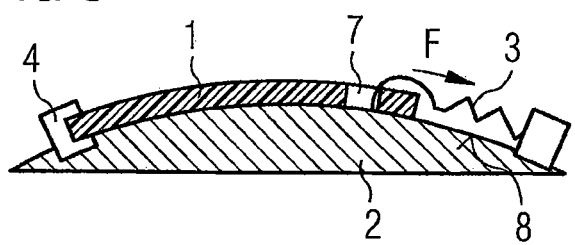
FIG. 3 illustrates a sectional view of a further retaining facility with a tension spring.

FIG. 3 shows a further embodiment of the retaining facility from FIG. 1. The tension spring 3 exerting the force is inserted into a correspondingly designed cutout 7 of the printed circuit board 1. The tension spring 3 may introduce the tensile force F into the printed circuit board 1. The printed circuit board 1 fixed in the fixing element 4 may be pressed onto the concave surface 8 of the carrier 2.

Figure 4:
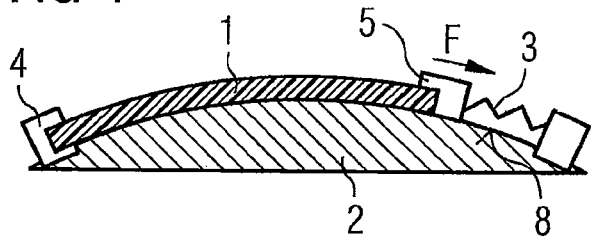
FIG. 4 illustrates a sectional view of a retaining facility with tension spring and coupling element.

FIG. 4 shows a further embodiment of the retaining facility from FIG. 1. A coupling element 5, which is structurally (solidly) connected in a detachable manner to the printed circuit board 1 is connected to the tension spring 3. The tensile force F presses the printed circuit board 1 fixed at one end into the fixing element onto the concave surface 8 of the carrier 2. The coupling element 5 may be used when the material of the printed circuit board 1 is relatively soft and/or flexible A number of coupling elements can also be attached to the printed circuit board 1. The coupling element 5 may, for example, be glued, screwed, soldered, riveted or clamped to the printed circuit board 1.

Figure 5:
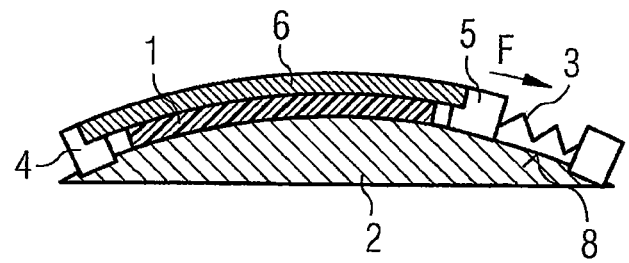
FIG. 5 illustrates a sectional view of retaining facility with tension spring, coupling element, and element to provide the tension.

By contrast with the previous embodiments, with the retaining facility depicted in FIG. 5, a tensile or compressive force may not act directly on the printed circuit board 1 itself but on a first connection device 6 connected to it. FIG. 5 shows a section through a retaining facility with a concave curved carrier 2 onto the surface 8 of which is pressed a printed circuit board 1 with the aid of a first connection device 6. A second connection device 3, for example, a tension spring, transmits a tensile force F to the first connection device 6. The first connection device 6 and the second connection device 3 are connected using a coupling element 5. At the end opposite the coupling element 5, the first connection device 6 is arranged solidly (fixed) in a fixing element 4. Advantageous materials for the first connection device 6 are Kevlar, glass, or carbon fibers or plastics reinforced with such fibers. The first connection device 6 may be embodied in a thin form, for example in the form of a thread or a wire, or in a flat form, for example as a film or as a tape. Permanently-elastic materials, such as a rubber band, can also be used for example.

Figure 6:
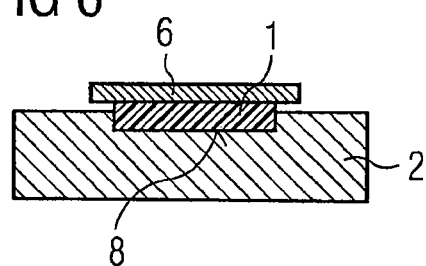
FIG. 6 illustrates a sectional view of a further retaining facility with an element to provide the tension.
Figure 7:
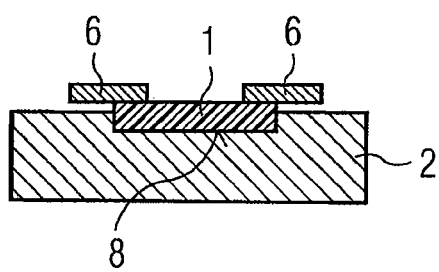
FIG. 7 illustrates a sectional view of a retaining facility with two elements to provide the tension.
Figure 8:
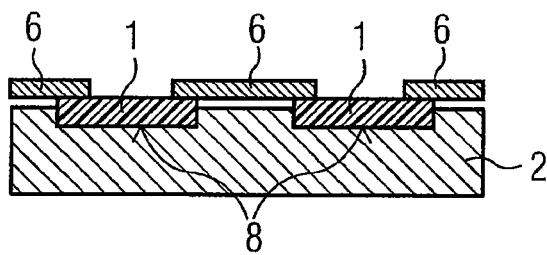
FIG. 8 illustrates a sectional view of a retaining facility with three elements to provide the tension.

The first connection device 6 may be arranged differently. FIGS. 6 to 8 show three exemplary embodiments in a sectional view perpendicular to the view depicted in FIG. 5. FIG. 6 shows the carrier 2 with a recess in which the printed circuit board 1 is secured against lateral shaking. A first connection device 6 may lie directly against the printed circuit board 1 and presses the printed circuit board against the carrier 2. FIG. 7 shows two first connection devices 6, which are arranged at the edge areas of the printed circuit board 1. The two connection devices 6 press the printed circuit board 1 against the carrier 2. FIG. 8 shows a simultaneous fixing of two printed circuit boards 1 by three first connection devices 6. The printed circuit boards 6 lie in parallel in recesses of the carrier 2 and are pressed at their edge areas by the three first connection devices 6 onto the carrier 2.

Figure 9A:
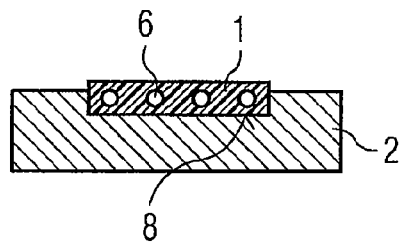
FIG. 9a illustrates a sectional view of a retaining facility with elements to provide the tension integrated into the printed circuit board.
Figure 9B:
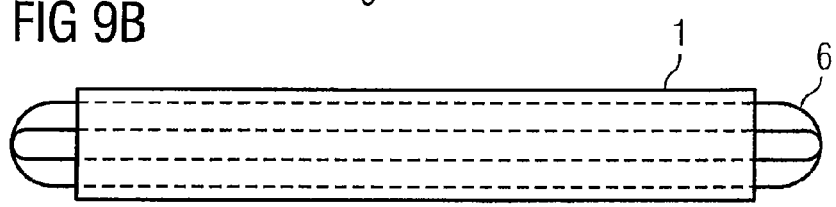
FIG. 9b illustrates a transparent overhead view of the retaining facility depicted in FIG. 9a, FIG. 10 illustrates a sectional view of a holder device with elements to provide tension integrated into the printed circuit board.
Figure 10:
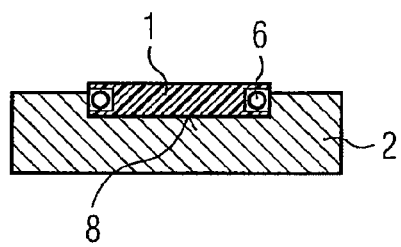
Figure 11A:
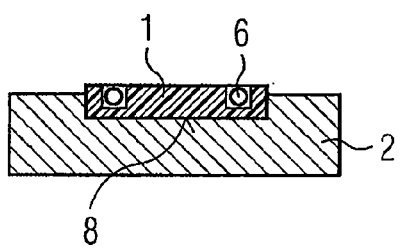
FIG. 11a illustrates a sectional view of a further holder device with elements to provide tension integrated into the printed circuit board.
Figure 11B:
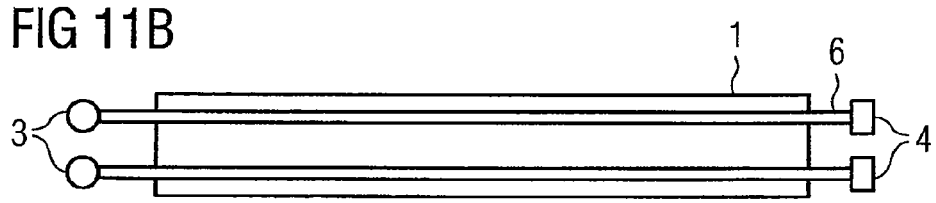
FIG. 11b illustrates a transparent overhead view of the retaining facility depicted in FIG. 11a, FIG. 12 illustrates a sectional view of a retaining facility with elements to provide tension arranged below the printed circuit board.

In a further embodiment, the first connection device may be integrated in the printed circuit board 1. FIG. 9a depicts a printed circuit board 1 with a number of first connection devices 6 which have already been introduced into the printed circuit board 1 during its production. The first connection devices 6 may be made of Kevlar or glass fibers. The first connection devices 6 may extend outwards in a longitudinal direction of the printed circuit board 1, as shown from above in FIG. 9b. FIG. 10 shows a variant in which two first connection devices 6 are arranged in lateral guide slots of the printed circuit board 1. FIG. 11a shows the arrangement of two first connection devices 6 in grooves on the surface of the printed circuit board 1. FIG. 11b shows the associated overhead view. FIG. 11b shows the printed circuit board 1 with the two first connection device 6. The first connection device 6 may be attached to the second connection device 3 at one end and may be attached to the fixing elements 4 at the other end.

The first connection device 6 may also be located in alternating positions on the upper and lower side of the printed circuit board 1, with the switch between upper and lower side preferably occurring at notches or cavities.

Figure 12:
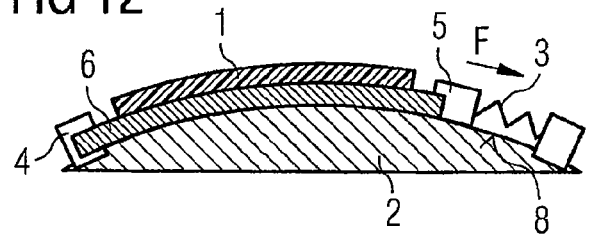

FIG. 12 shows a sectional view of a concave curved carrier 2 with a curved printed circuit board 1, with the printed circuit board 1 now not being pressed directly onto the carrier 2 but being arranged with a positive fit on a first connection device 6. The first connection device 6 is pressed by tensile force F onto the concave surface 8 of the carrier 2. The tensile force F is applied via a coupling element 5 connected to the first connection device 6. The tensile force F is produced by a second connection device connected to the coupling element 5 and the support 2, for example, a tension spring. The permanent connection between printed circuit board 1 and first connection device 6 is made, for example, by gluing, screwing, soldering, riveting or clamping.

Figure 13:
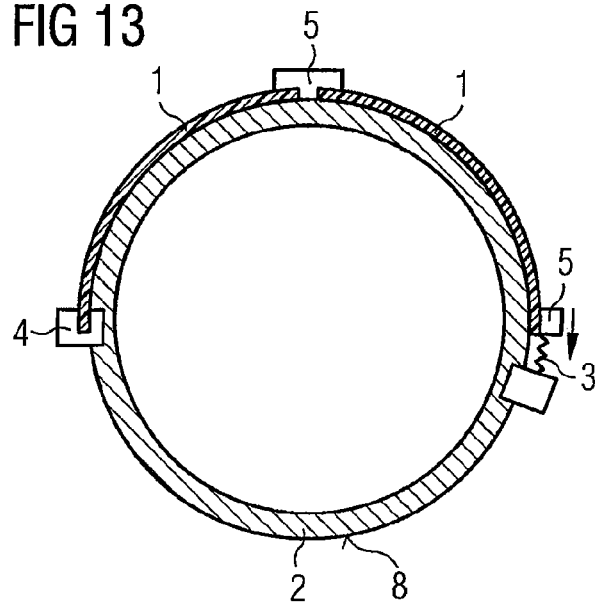
FIG. 13 illustrates a sectional view of a retaining facility with two printed circuit boards and FIG. 14 illustrates a sectional view of a further retaining facility with two printed circuit boards.
Figure 14:
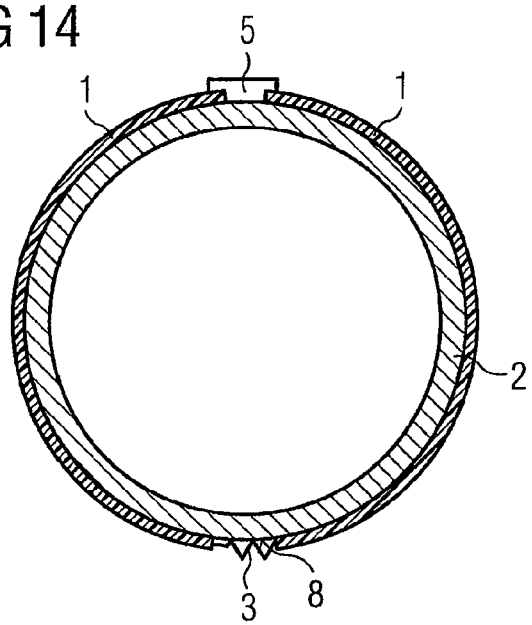

A mechanical coupling of a number of printed circuit boards 1 on a carrier 2 is shown in FIGS. 13 and 14. FIG. 13 shows a sectional view of a cylindrical carrier 2 on the concave surface 8 of which are arranged two printed circuit boards 1. The two printed circuit boards 1 are connected to each other by connection device of a coupling element 5. Through a second connection device 3, a tensile force F is applied via a further coupling element 5 in the first printed circuit board 1. The second printed circuit board 1 is held in a fixing element 4 on the surface of the carrier 2. Alternatively, one end of each printed circuit board 1 respectively can be provided with a second connection device 3.

FIG. 14 shows a sectional view of a ring-shaped carrier 2 with two printed circuit boards 1. The two printed circuit boards 1 are connected at one end with a coupling element 5. The two other ends are connected to a second connection device 3. This enables the two printed circuit boards 1 to be pressed under tension onto the concave surface 8 of the carrier 2.

FIGS. 13 and 14 show embodiments as would also be employed in computer tomography.

Various embodiments described herein can be used alone or in combination with one another. The above description has described only a few of the many possible implementations of the present invention. For this reason, this above description is intended by way of illustration, and not by way of limitation. It is only the following claims, including all equivalents that are intended to define the scope of this invention.

The invention claimed is:

1. A retaining facility for clearance-free fixing of printed circuit boards onto a one-dimensional curved surface, wherein, in a direction of curvature of the one-dimensional curved surface, a variable tensile or compressive force acts on an end of a printed circuit board or on an end of at least one first connection device connected to the printed circuit board, the tensile or compressive force causing the printed circuit board to bend and be pressed onto the one-dimensional curved surface in a clearance-free manner.

2. The retaining facility as claimed in claim 1, wherein at least one second connection device is arranged and configured so as to introduce the tensile or compressive force into the printed circuit board or into the at least one first connection device.

3. The retaining facility as claimed in claim 2, wherein the at least one second connection device is a tension or compression spring.

4. The retaining facility as claimed in claim 2, wherein one end of the printed circuit board or the at least one first connection device is held in the direction of curvature of the one-dimensional curved surface at one end of a fixing element, and
wherein another end of the printed circuit board or of the first connection device is connected to the at least one second connection device.

5. The retaining facility as claimed in claim 2, wherein the at least one second connection device is connected via at least one coupling element to the printed circuit board or to the at least one first connection device.

6. The retaining facility as claimed in claim 1, wherein the at least one first connection device is configured in the form of a bar and is fed through the inside of the printed circuit board or in grooves of the printed circuit board.

7. The retaining facility as claimed in claim 1, wherein the printed circuit board or the at least one first connection device is guided laterally in the direction of curvature of the one-dimensional curved surface.

8. The retaining facility as claimed in claim 7, wherein the guidance is undertaken by a recess in the one-dimensional curved surface, by at least one lateral groove arranged in the one-dimensional curved surface or by lateral delimiting elements arranged on the one-dimensional curved surface.

9. The retaining facility of claim 1, wherein the end of the printed circuit board or the end of the at least one first connection device faces in the direction of curvature of the one-dimensional curved surface.

10. A retaining facility for clearance-free fixing of printed circuit boards onto a one-dimensional curved surface, wherein, in a direction of curvature of the one-dimensional curved surface, a variable tensile or compressive force acts on an end of at least one first connection device structurally connected in a detachable manner to the printed circuit board, the tensile or compressive force causing the at least one first connection device and the printed circuit board to be bent and the at least one first connection device to be pressed onto the one-dimensional curved surface in a clearance-free manner.

11. The retaining facility as claimed in claim 10, wherein at least one second connection device is arranged and configured so as to introduce the tensile or compressive force into the printed circuit board or into the at least one first connection device.

12. The retaining facility as claimed in claim 11, wherein the at least one second connection device is a tension or compression spring.

13. The retaining facility as claimed in claim 11, wherein one end of the printed circuit board or the at least one first connection device is held in the direction of curvature of the one-dimensional curved surface at one end of a fixing element, and
wherein another end of the printed circuit board or of the at least one first connection device is connected to the at least one second connection device.

14. The retaining facility as claimed in claim 11, wherein the at least one second connection device is connected via at least one coupling element to the printed circuit board or to the at least one first connection device.

15. The retaining facility as claimed in claim 10, wherein the at least one first connection device is configured in the form of a bar and is fed through the inside of the printed circuit board or in grooves of the printed circuit board.

16. The retaining facility as claimed in claim 10, wherein the printed circuit board or the at least one first connection device is guided laterally in the direction of curvature of the one-dimensional curved surface.

17. The retaining facility as claimed in claim 16, wherein the guidance is undertaken by a recess in the one-dimensional curved surface, by at least one lateral groove arranged in the one-dimensional curved surface or by lateral delimiting elements arranged on the one-dimensional curved surface.

18. A computer tomography system comprising:
a cylindrical carrier having a curved surface;
a fixing element structurally connected to the curved surface;
a printed circuit board having a first end and a second end, the first end being connected to the fixing element; and at least one connection device arranged and configured so as to introduce a variable tensile or compressive force into the second end of the printed circuit board, the at least one connection device being connected to the second end of the printed circuit board, wherein the tensile or compressive force acts on the printed circuit board in a direction of curvature of the curved surface, the tensile or compressive force causing the printed circuit board to bend and be pressed onto the curved surface.

* * * * *